(12) United States Patent
Yoshida et al.

(10) Patent No.: US 12,035,472 B2
(45) Date of Patent: Jul. 9, 2024

(54) STACKABLE VIA PACKAGE AND METHOD

(71) Applicant: Amkor Technology Singapore Holding Pte. Ltd., Singapore (SG)

(72) Inventors: Akito Yoshida, Chandler, AZ (US); Mahmoud Dreiza, Phoenix, AZ (US); Curtis Michael Zwenger, Chandler, AZ (US)

(73) Assignee: Amkor Technology Singapore Holding Ptd. Ltd., Singapore (SG)

( * ) Notice: Subject to any disclaimer, the term of this patent is extended or adjusted under 35 U.S.C. 154(b) by 0 days.

(21) Appl. No.: 18/220,026

(22) Filed: Jul. 10, 2023

(65) Prior Publication Data

US 2023/0354523 A1 Nov. 2, 2023

Related U.S. Application Data

(63) Continuation of application No. 17/395,893, filed on Aug. 6, 2021, now Pat. No. 11,700,692, which is a
(Continued)

(51) Int. Cl.
*H05K 1/11* (2006.01)
*H01L 21/56* (2006.01)
(Continued)

(52) U.S. Cl.
CPC .............. *H05K 1/14* (2013.01); *H01L 21/56* (2013.01); *H01L 23/3107* (2013.01);
(Continued)

(58) Field of Classification Search
CPC . H05K 1/11; H05K 1/14; H05K 1/181; H05K 1/184
See application file for complete search history.

(56) References Cited

U.S. PATENT DOCUMENTS

| 3,868,724 A | 2/1975 | Perrino |
| 3,916,434 A | 10/1975 | Garboushian |
(Continued)

FOREIGN PATENT DOCUMENTS

| JP | 05-109975 | 4/1993 |
| JP | 05-136323 | 6/1993 |
(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).
(Continued)

*Primary Examiner* — Jeremy C Norris
(74) *Attorney, Agent, or Firm* — McAndrews, Held & Malloy, Ltd.

(57) ABSTRACT

A stackable via package includes a substrate having an upper surface and a trace on the upper surface, the trace including a terminal. A solder ball is on the terminal. The solder ball has a solder ball diameter A and a solder ball height D. A via aperture is formed in a package body enclosing the solder ball to expose the solder ball. The via aperture includes a via bottom having a via bottom diameter B and a via bottom height C from the upper surface of the substrate, where A<B and 0=<C<1/2×D. The shape of the via aperture prevents solder deformation of the solder column formed from the solder ball as well as prevents solder bridging between adjacent solder columns.

20 Claims, 11 Drawing Sheets

Related U.S. Application Data continuation of application No. 16/774,233, filed on Jan. 28, 2020, now Pat. No. 11,089,685, which is a continuation of application No. 16/272,135, filed on Feb. 11, 2019, now Pat. No. 10,548,221, which is a continuation of application No. 16/042,312, filed on Jul. 23, 2018, now Pat. No. 10,206,285, which is a continuation of application No. 15/670,908, filed on Aug. 7, 2017, now Pat. No. 10,034,372, which is a continuation of application No. 14/657,032, filed on Mar. 13, 2015, now Pat. No. 9,730,327, which is a continuation of application No. 14/246,286, filed on Apr. 7, 2014, now Pat. No. 9,012,789, which is a continuation of application No. 13/528,206, filed on Jun. 20, 2012, now Pat. No. 8,704,368, which is a continuation of application No. 12/483,913, filed on Jun. 12, 2009, now Pat. No. 8,222,538.

(51) Int. Cl.

| | | |
|---|---|---|
| *H01L 23/00* | (2006.01) | |
| *H01L 23/31* | (2006.01) | |
| *H01L 23/498* | (2006.01) | |
| *H05K 1/14* | (2006.01) | |
| *H05K 1/18* | (2006.01) | |
| *H05K 3/30* | (2006.01) | |
| *H05K 3/34* | (2006.01) | |
| *H05K 3/36* | (2006.01) | |
| *H05K 3/40* | (2006.01) | |

(52) U.S. Cl.
CPC .... *H01L 23/3128* (2013.01); *H01L 23/49811* (2013.01); *H01L 24/10* (2013.01); *H01L 24/16* (2013.01); *H01L 24/81* (2013.01); *H05K 1/11* (2013.01); *H05K 1/181* (2013.01); *H05K 1/184* (2013.01); *H05K 1/185* (2013.01); *H05K 3/303* (2013.01); *H05K 3/34* (2013.01); *H05K 3/363* (2013.01); *H05K 3/4007* (2013.01); *H01L 23/3171* (2013.01); *H01L 2224/1191* (2013.01); *H01L 2224/13021* (2013.01); *H01L 2224/13022* (2013.01); *H01L 2224/16055* (2013.01); *H01L 2224/1607* (2013.01); *H01L 2224/16111* (2013.01); *H01L 2224/16113* (2013.01); *H01L 2224/16238* (2013.01); *H01L 2224/48091* (2013.01); *H01L 2224/48227* (2013.01); *H01L 2224/73265* (2013.01); *H01L 2224/81815* (2013.01); *H01L 2924/01029* (2013.01); *H01L 2924/01079* (2013.01); *H05K 3/3436* (2013.01); *H05K 2201/10515* (2013.01); *H05K 2201/10977* (2013.01); *H05K 2203/043* (2013.01); *Y10T 29/49165* (2015.01)

(56) References Cited

U.S. PATENT DOCUMENTS

| | | |
|---|---|---|
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Mover |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,288,944 A | 2/1994 | Bronson |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,137,062 A | 10/2000 | Zimmerman |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |

(56) References Cited

U.S. PATENT DOCUMENTS

| | | |
|---|---|---|
| D446,525 S | 8/2001 | Okamoto et al. |
| 6,274,821 B1 | 8/2001 | Echigo et al. |
| 6,280,641 B1 | 8/2001 | Gaku et al. |
| 6,307,161 B1 | 10/2001 | Grube et al. |
| 6,316,285 B1 | 11/2001 | Jiang et al. |
| 6,329,609 B1 | 12/2001 | Kaja et al. |
| 6,351,031 B1 | 2/2002 | Ijima et al. |
| 6,353,999 B1 | 3/2002 | Cheng |
| 6,365,962 B1 | 4/2002 | Liang |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,573,598 B2 | 6/2003 | Ohuchi et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,953,995 B2 | 10/2005 | Farnworth et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,125,744 B2 | 10/2006 | Takehara et al. |
| 7,185,426 B1 | 3/2007 | Hiner et al. |
| 7,198,980 B2 | 4/2007 | Jiang et al. |
| 7,215,026 B2 | 5/2007 | Park et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,642,133 B2 | 1/2010 | Wu et al. |
| 7,671,457 B1 | 3/2010 | Hiner et al. |
| 7,777,351 B1 | 8/2010 | Berry et al. |
| 7,825,520 B1 | 11/2010 | Longo et al. |
| 7,960,827 B1 | 6/2011 | Miller, Jr. et al. |
| 8,115,316 B2 | 2/2012 | Kohara et al. |
| 8,222,538 B1 | 7/2012 | Yoshida et al. |
| 8,341,835 B1 | 1/2013 | Huemoeller et al. |
| 8,704,368 B1 | 4/2014 | Yoshida et al. |
| 9,012,789 B1 | 4/2015 | Yoshida et al. |
| 9,730,327 B1 | 8/2017 | Yoshida et al. |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0141582 A1 | 7/2003 | Yang et al. |
| 2003/0197284 A1 | 10/2003 | Khiang et al. |
| 2003/0201309 A1 | 10/2003 | Grigg et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2004/0165362 A1 | 8/2004 | Farnworth |
| 2005/0139985 A1 | 6/2005 | Takahashi |
| 2005/0184371 A1 | 8/2005 | Yang |
| 2005/0242425 A1 | 11/2005 | Leal et al. |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0230887 A1 | 9/2008 | Sun et al. |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Kim et al., "Application of Through Mold via (TMV) as PoP base package", 58.sup.th ECTC Proceedings, May 2008, Lake Buena Vista, FL, 6 pages, IEEE.

Scanlan, "Package-on-package (POP) with Through-mold Vias", Advanced Packaging, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

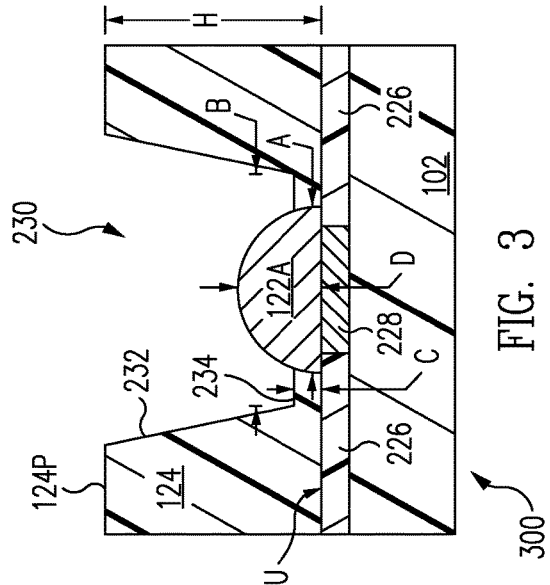
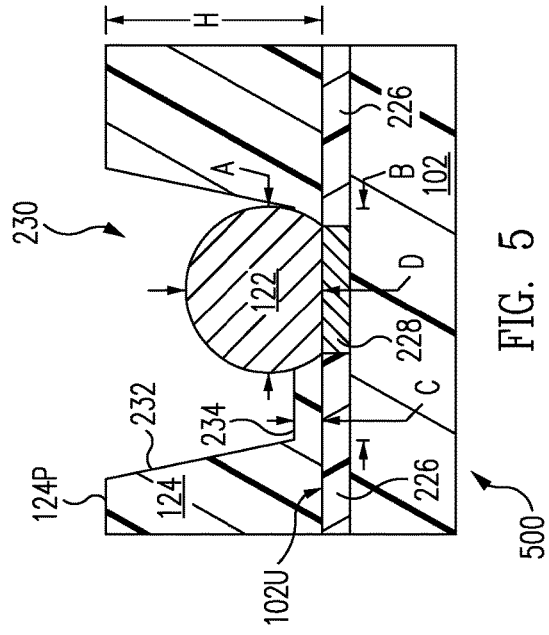
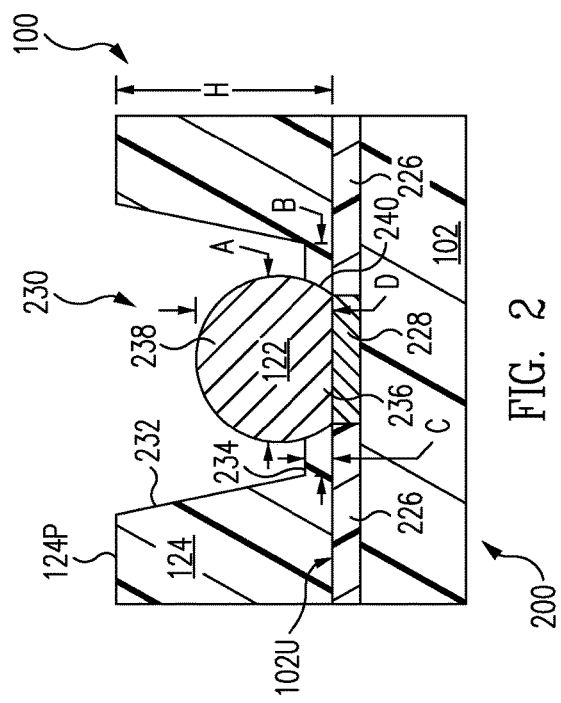
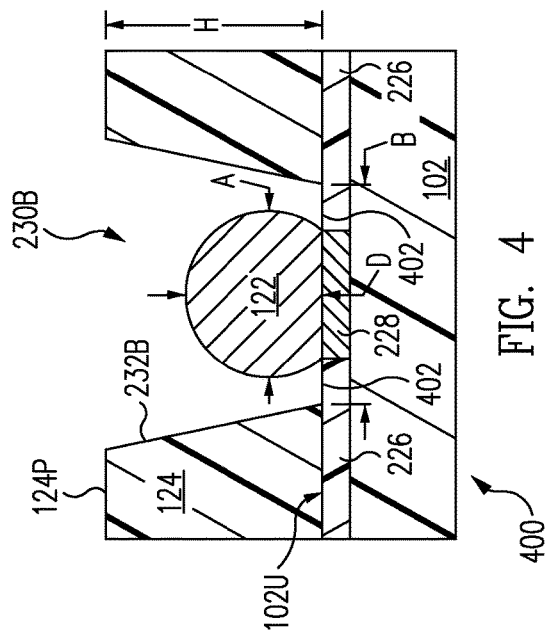

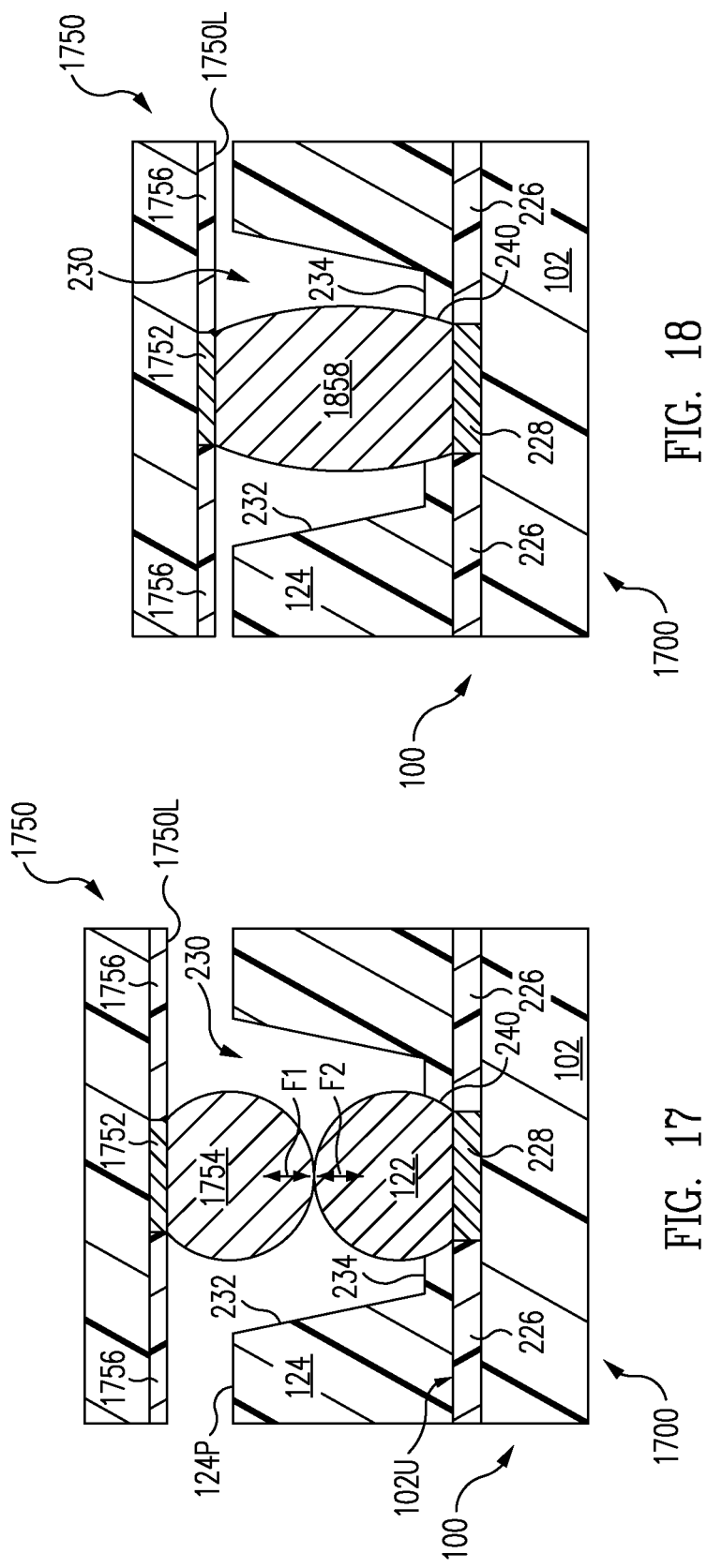

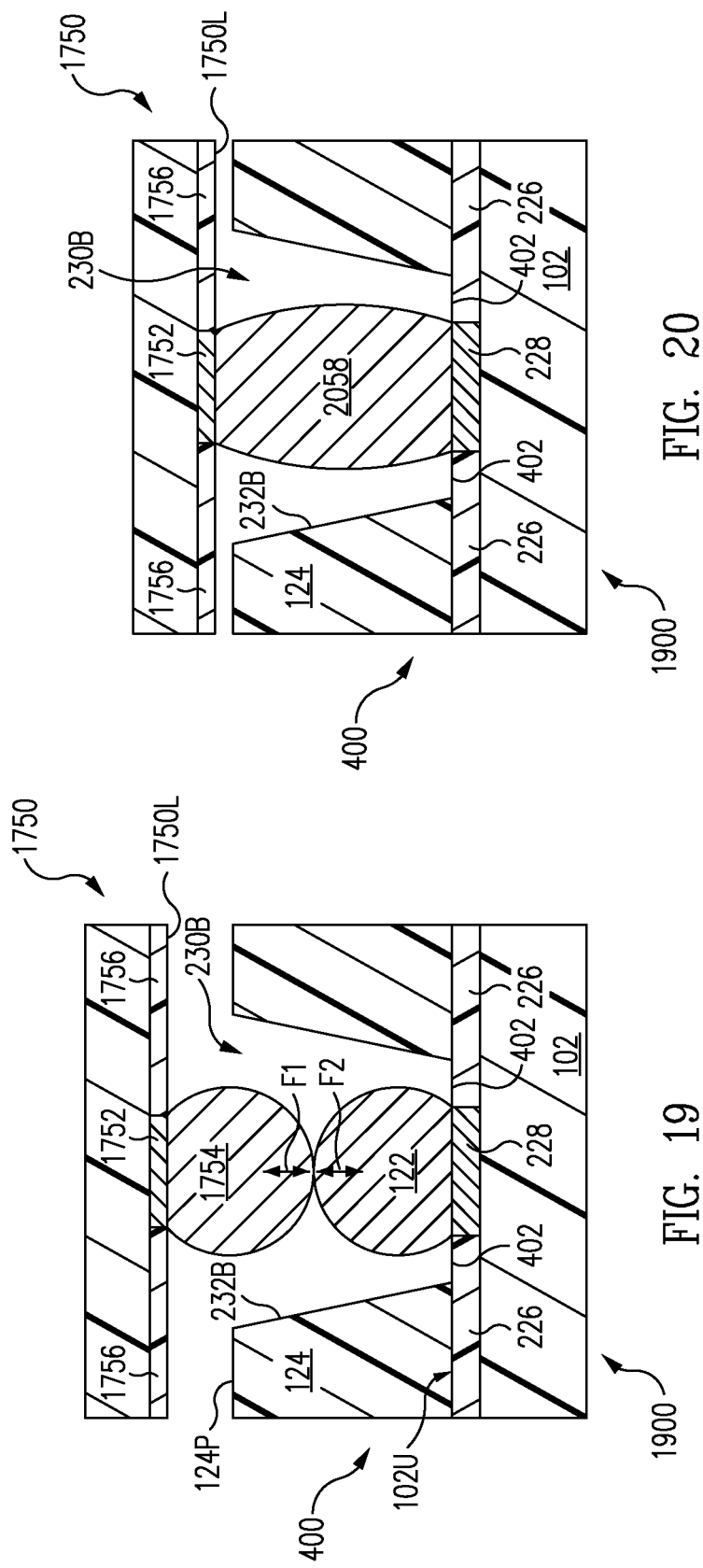

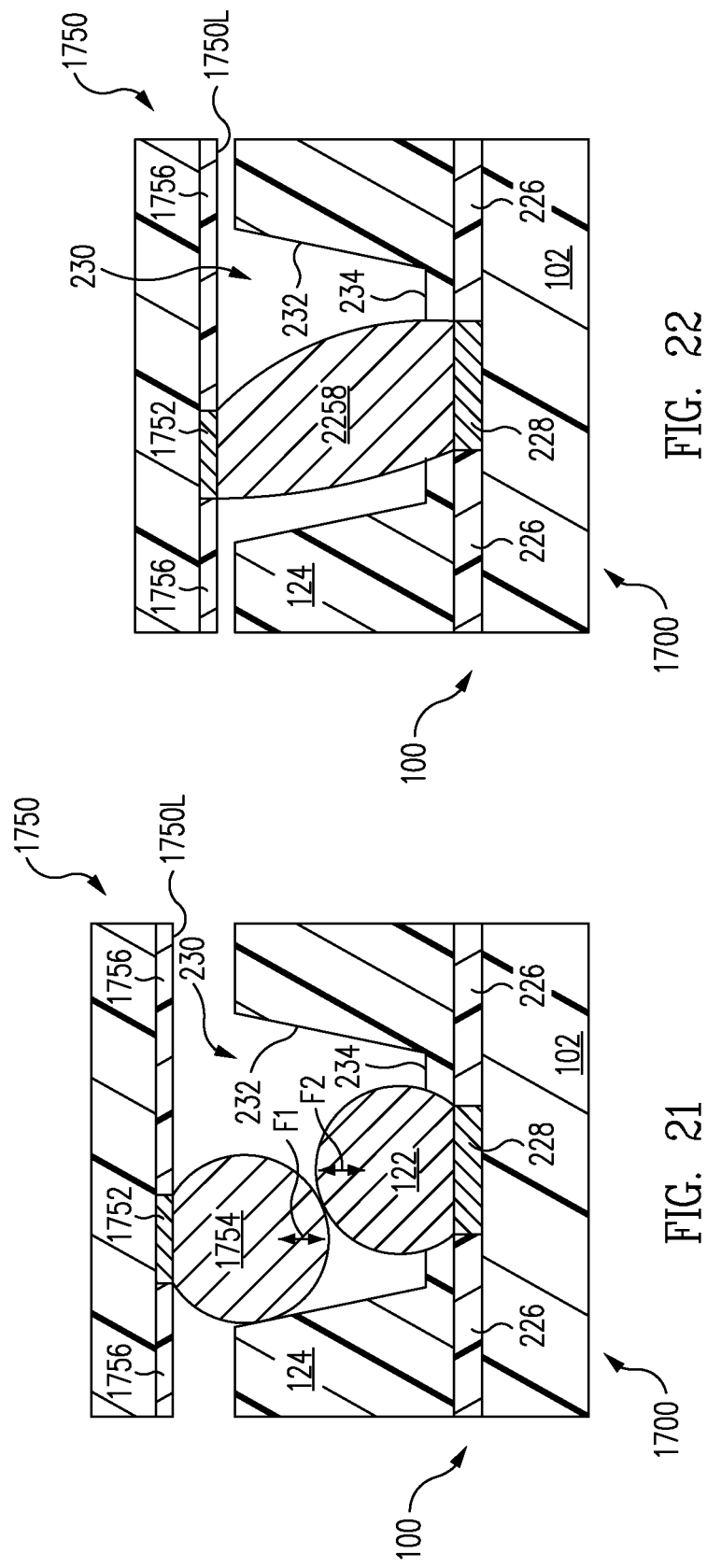

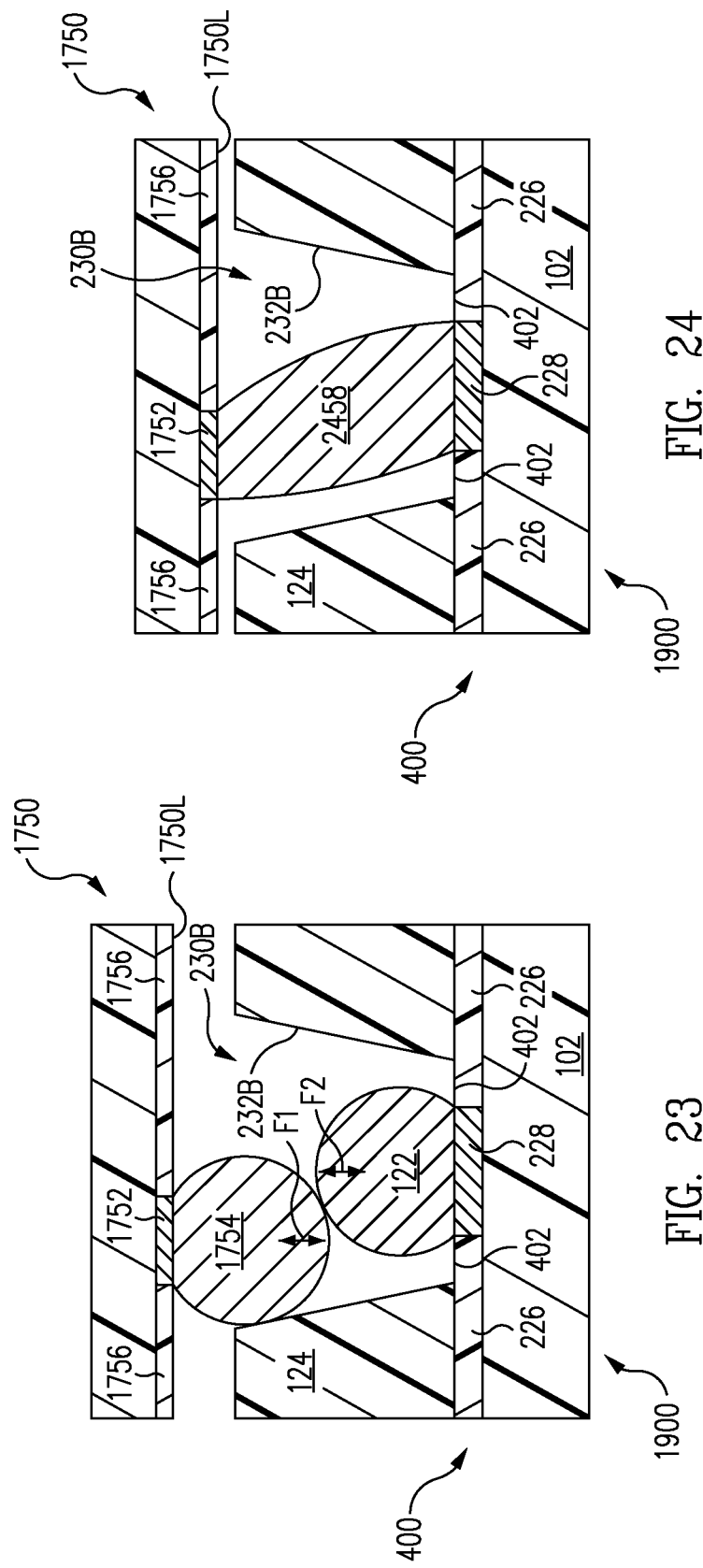

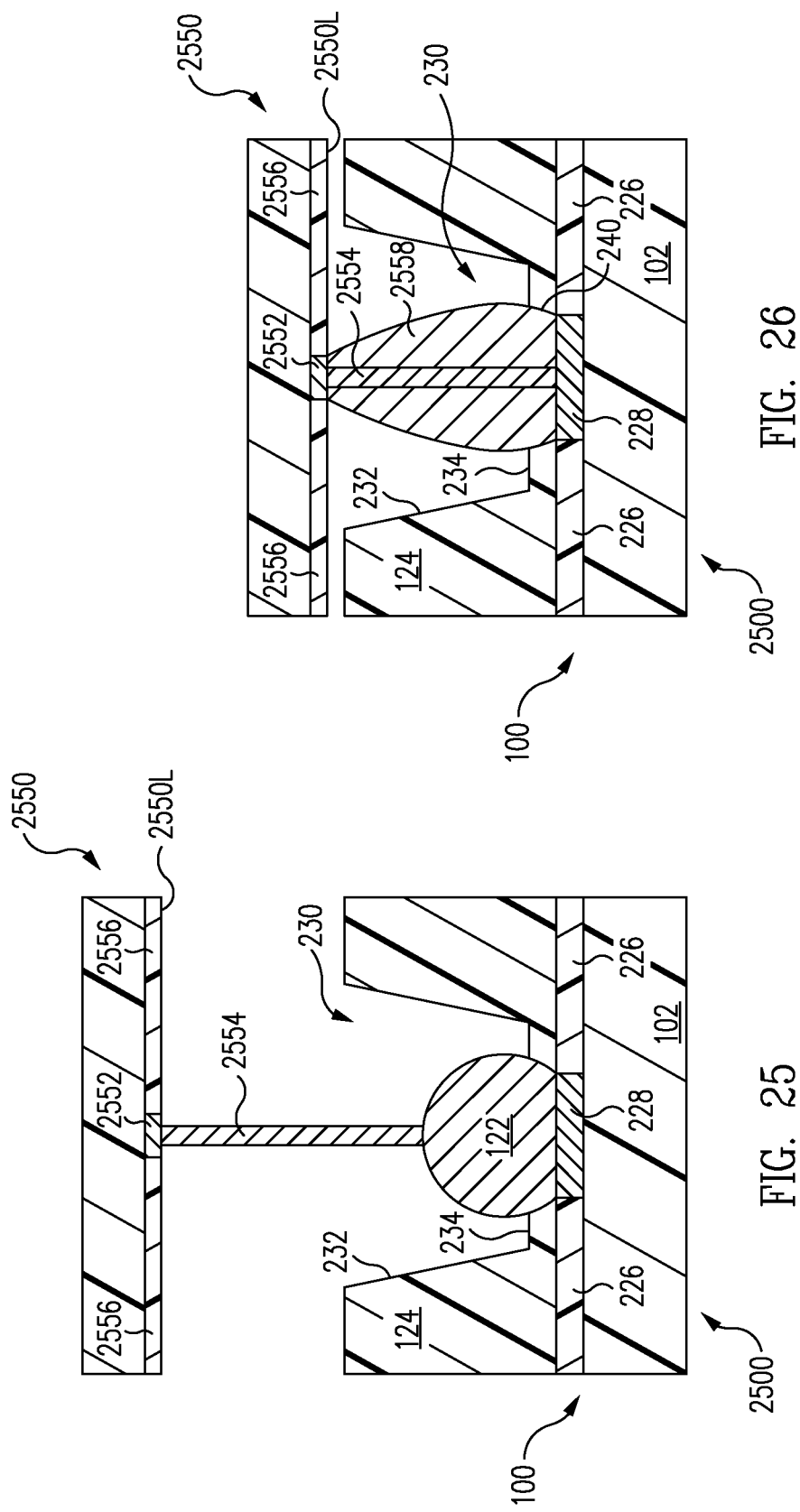

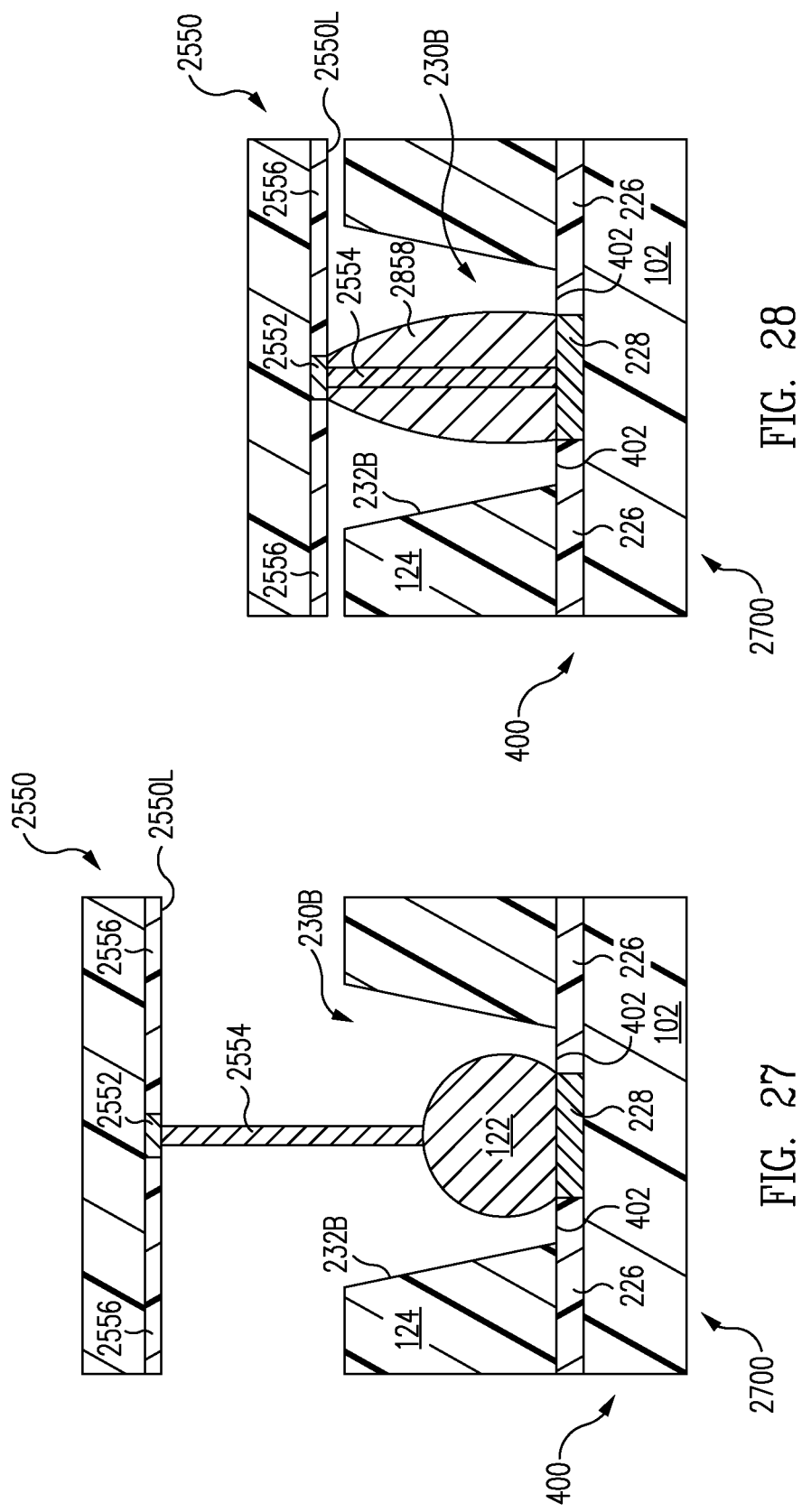

STACKABLE VIA PACKAGE AND METHOD

CROSS-REFERENCE TO RELATED APPLICATIONS/INCORPORATION BY REFERENCE

The present application is a continuation of U.S. patent application Ser. No. 17/395,893, filed Aug. 6, 2021, and titled "STACKABLE VIA PACKAGE AND METHOD," expected to issue as U.S. Pat. No. 11,700,692; which is a continuation of U.S. patent application Ser. No. 16/774,233, filed Jan. 28, 2020, and titled "STACKABLE VIA PACKAGE AND METHOD," now U.S. Pat. No. 11,089,685; which is a continuation of co-pending U.S. patent application Ser. No. 16/272,135, filed Feb. 11, 2019, and titled "STACKABLE VIA PACKAGE AND METHOD," now U.S. Pat. No. 10,548,221; which is a continuation of U.S. application Ser. No. 16/042,312, filed Jul. 23, 2018, and titled "STACKABLE VIA PACKAGE AND METHOD," now U.S. Pat. No. 10,206,285; which is a continuation of U.S. application Ser. No. 15/670,908, filed Aug. 7, 2017, and titled "STACKABLE VIA PACKAGE AND METHOD," now U.S. Pat. No. 10,034,372; which is a continuation of U.S. application Ser. No. 14/657,032, filed Mar. 13, 2015, and titled "STACKABLE VIA PACKAGE AND METHOD," now U.S. Pat. No. 9,730,327; which is a continuation of U.S. application Ser. No. 14/246,286, filed Apr. 7, 2014, and titled "STACKABLE VIA PACKAGE AND METHOD, now U.S. Pat. No. 9,012,789; which is a continuation of U.S. application Ser. No. 13/528,206, filed Jun. 20, 2012, and titled "STACKABLE VIA PACKAGE AND METHOD," now U.S. Pat. No. 8,704,368; which is a continuation of U.S. application Ser. No. 12/483,913, filed Jun. 12, 2009, and titled "STACKABLE VIA PACKAGE AND METHOD," now U.S. Pat. No. 8,222,538. Each of the above-mentioned applications is hereby incorporated herein by reference in its entirety.

BACKGROUND OF THE INVENTION

Field of the Invention

The present application relates to the field of electronics, and more particularly, to methods of forming electronic component packages and related structures.

Description of the Related Art

To form an electronic component package, an electronic component is mounted to a substrate. The substrate includes traces on the same surface of the substrate to which the electronic component is mounted. Bond wires are formed to electrically connect bond pads of the electronic component to the traces.

To protect the electronic component as well as the bond wires, the electronic component and bond wires are covered in an encapsulant. The traces extend from under the encapsulant to an exposed area of the surface of the substrate outside of the periphery of the encapsulant, i.e., not covered by the encapsulant. The traces include terminals on the exposed area of the substrate outside of and around the encapsulant.

Solder balls are formed on the terminals. These solder balls extend from the substrate to a height greater than the height of the encapsulant to allow the solder balls to be electrically connected to a larger substrate such as a printed circuit motherboard.

However, the solder balls are substantially spherical in shape. Thus, forming the solder balls with a height greater than the height of the encapsulant places fundamental restrictions on minimizing the pitch of the solder balls.

SUMMARY OF THE INVENTION

In accordance with one embodiment, a stackable via package includes a substrate having an upper surface and a trace on the upper surface, the trace including a terminal. A solder ball is on the terminal. The solder ball has a solder ball diameter A and a solder ball height D.

A via aperture is formed in a package body enclosing the solder ball to expose the solder ball. The via aperture includes a via bottom having a via bottom diameter B and a via bottom height C from the upper surface of the substrate, where $A<B$ and $0=<C<1/2\times D$. The shape of the via aperture prevents solder deformation of the solder column formed from the solder ball as well as prevents solder bridging between adjacent solder columns.

These and other features of the present invention will be more readily apparent from the detailed description set forth below taken in conjunction with the accompanying drawings.

BRIEF DESCRIPTION OF THE DRAWINGS

FIG. 2 is an enlarged cross-sectional view of the region II of the stackable via package of FIG. 1 after formation of a via aperture solder ball structure in accordance with one embodiment;

FIGS. 3, 4, 5, 6, 7, 8, 9, 10, 11, 12, 13, 14, 15, 16 are enlarged cross-sectional views of via aperture solder ball structures in accordance with various embodiments;

FIG. 17 is a cross-sectional view of an electronic component assembly including the stackable via package of FIGS. 1, 2 during fabrication in accordance with one embodiment;

FIG. 18 is a cross-sectional view of the electronic component assembly of FIG. 17 at a later stage during fabrication in accordance with one embodiment;

FIG. 19 is a cross-sectional view of an electronic component assembly including a stackable via package having the via aperture solder ball structure of FIG. 4 during fabrication in accordance with one embodiment;

FIG. 20 is a cross-sectional view of the electronic component assembly of FIG. 19 at a later stage during fabrication in accordance with one embodiment;

FIG. 21 is a cross-sectional view of the electronic component assembly of FIG. 17 having misalignment between an interconnection ball and a solder ball in accordance with one embodiment;

FIG. 22 is a cross-sectional view of the electronic component assembly of FIG. 21 at a later stage during fabrication in accordance with one embodiment;

FIG. 23 is a cross-sectional view of the electronic component assembly of FIG. 19 having misalignment between an interconnection ball and a solder ball in accordance with one embodiment;

FIG. 24 is a cross-sectional view of the electronic component assembly of FIG. 23 at a later stage during fabrication in accordance with one embodiment;

FIG. 25 is a cross-sectional view of an electronic component assembly including the stackable via package of FIGS. 1, 2 during fabrication in accordance with one embodiment;

FIG. 26 is a cross-sectional view of the electronic component assembly of FIG. 25 at a later stage during fabrication in accordance with one embodiment;

FIG. 27 is a cross-sectional view of an electronic component assembly including a stackable via package having the via aperture solder ball structure of FIG. 4 during fabrication in accordance with one embodiment; and FIG. 28 is a cross-sectional view of the electronic component assembly of FIG. 27 at a later stage during fabrication in accordance with one embodiment.

In the following description, the same or similar elements are labeled with the same or similar reference numbers.

DETAILED DESCRIPTION

Figure 1:
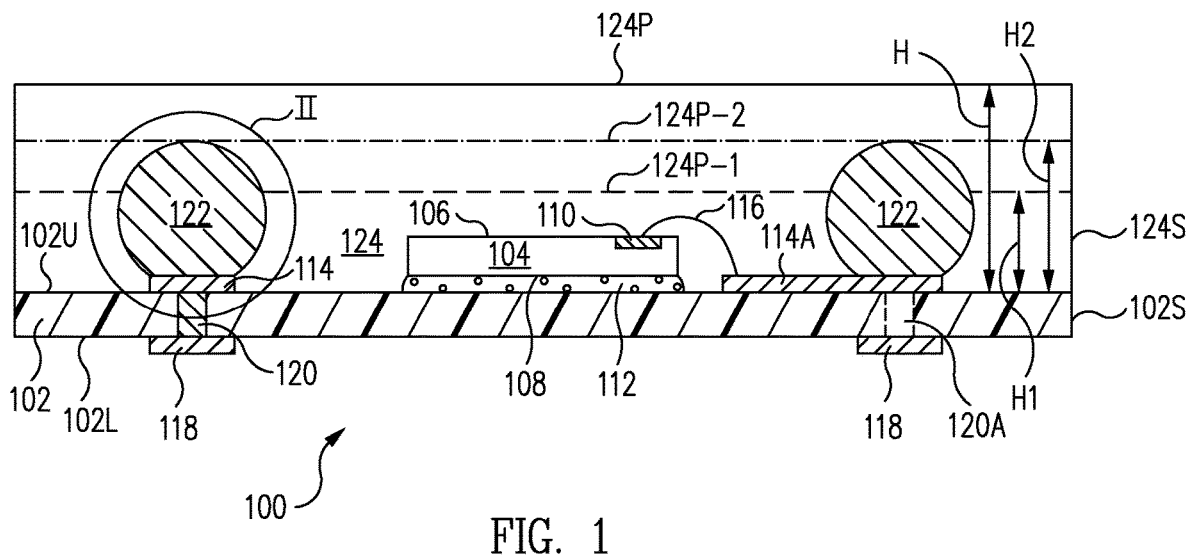
FIG. 1 is a cross-sectional view of a stackable via package during fabrication in accordance with one embodiment.
Figure 6:
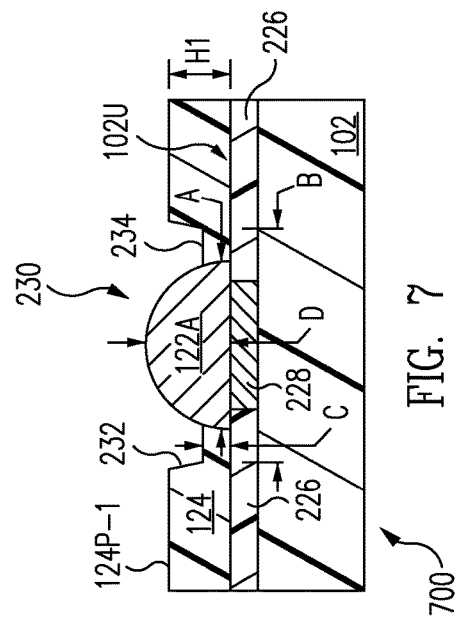
Figure 7:
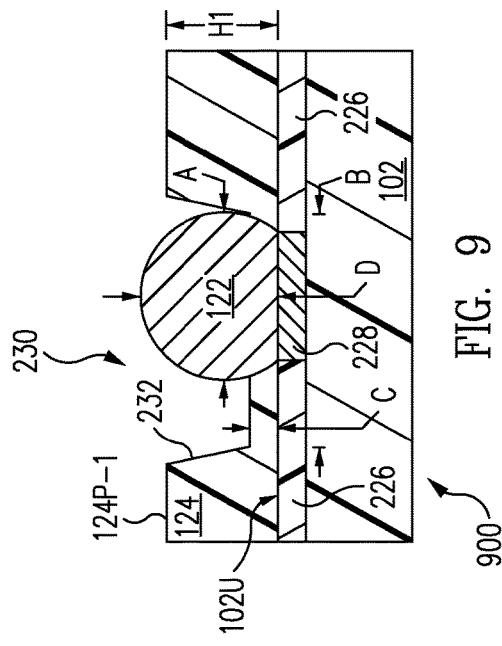
Figure 8:
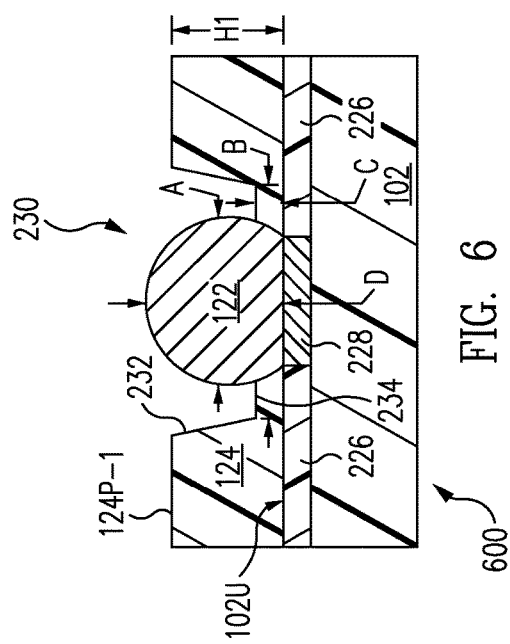
Figure 9:
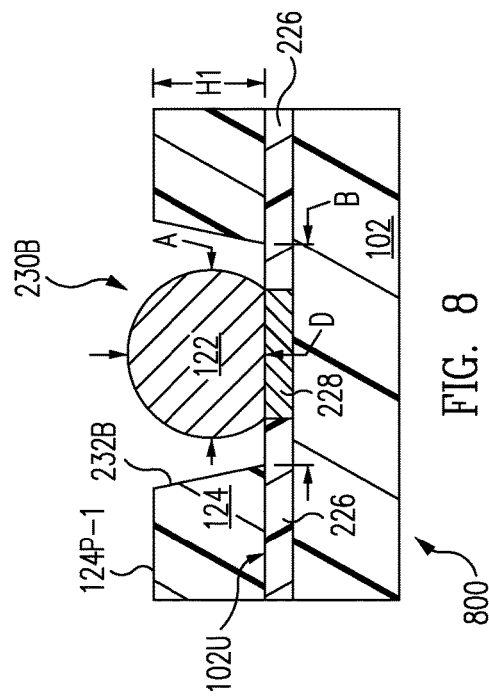
Figure 10:
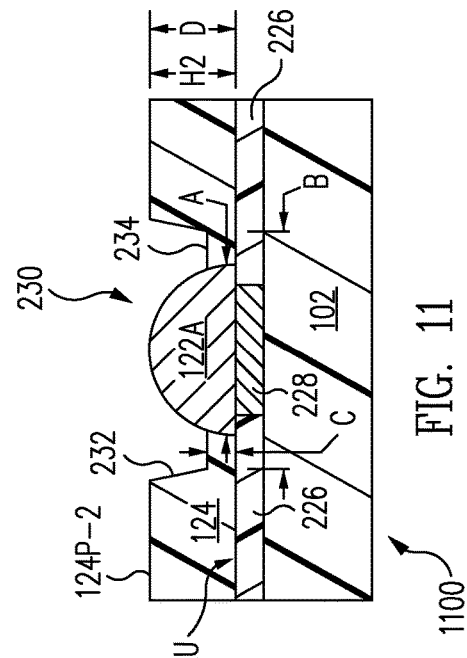
Figure 11:
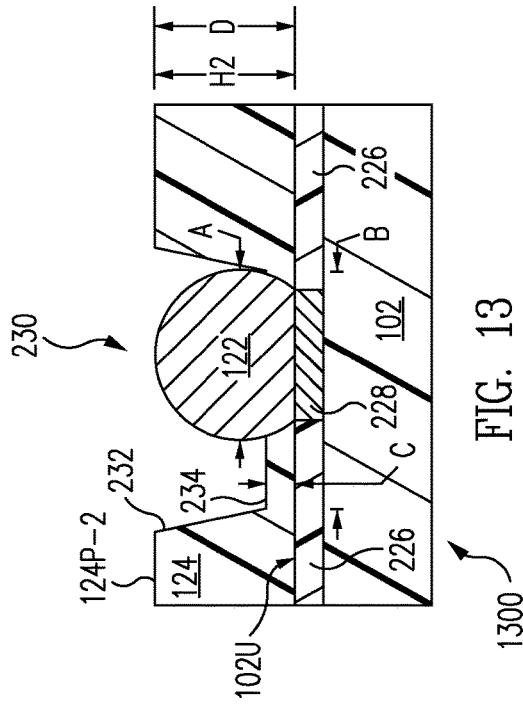
Figure 12:
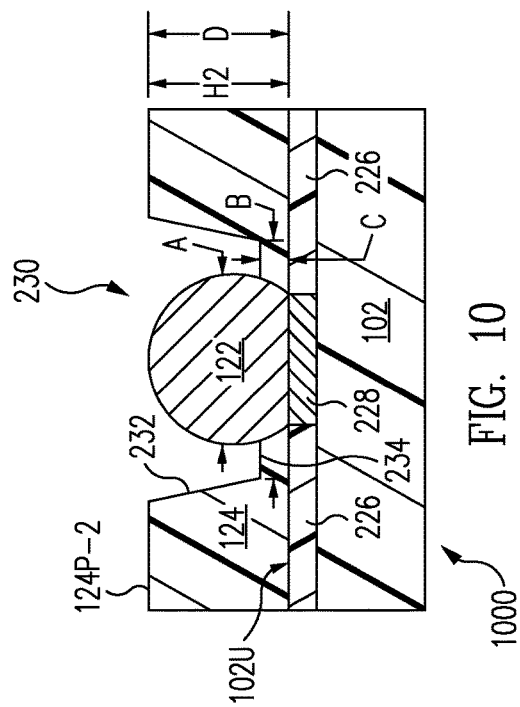
Figure 13:
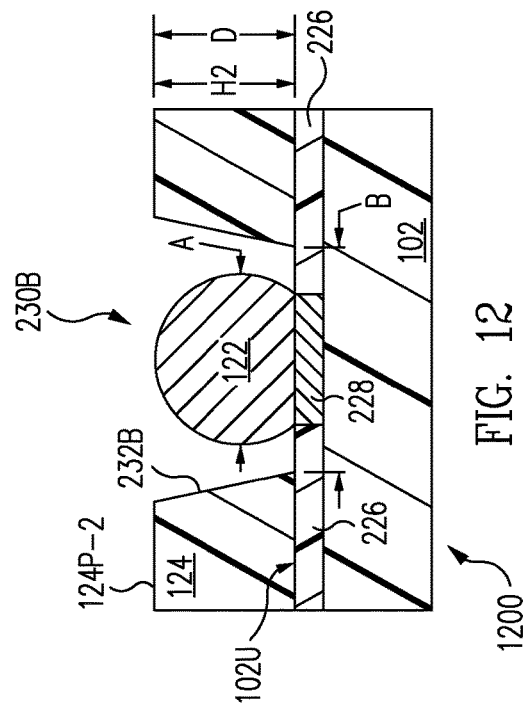

As an overview and in accordance with one embodiment, referring to FIGS. 1 and 2 together, a stackable via package 100 includes a substrate 102 having an upper surface 102U and a trace 114 on upper surface 102U, trace 114 including a terminal 228. A solder ball 122 is on terminal 228. Solder ball 122 has a solder ball diameter A and a solder ball height D.

A via aperture 230 is formed in a package body 124 enclosing solder ball 122 to expose solder ball 122. Via aperture 230 includes a via bottom 234, sometimes called a via aperture shelf, having a via bottom diameter B and a via bottom height C from upper surface 102U of substrate 102, where A<B and 0=<C<1/2×D. The shape of via aperture 230 prevents solder deformation of the solder column formed from solder ball 122 as well as prevents solder bridging between adjacent solder columns.

Now in more detail, FIG. 1 is a cross-sectional view of a stackable via package 100 during fabrication in accordance with one embodiment. Stackable via package 100, sometimes called an electronic component package, includes a substrate 102 including an upper, e.g., first, surface 102U and an opposite lower, e.g., second, surface 102L. Substrate 102 further includes sides 102S extending perpendicularly between upper surface 102U and lower surface 102L. Substrate 102 is a dielectric material such as laminate, ceramic, printed circuit board material, or other dielectric material.

Stackable via package 100 further includes an electronic component 104. In one embodiment, electronic component 104 is an integrated circuit chip, e.g., an active component. However, in other embodiments, electronic component 104 is a passive component such as a capacitor, resistor, or inductor.

In accordance with this embodiment, electronic component 104 includes an active surface 106 and an opposite inactive surface 108. Electronic component 104 further includes bond pads 110 formed on active surface 106. Inactive surface 108 is mounted to upper surface 102U of substrate 102 with an adhesive 112, sometimes called a die attach adhesive.

Although electronic component 104 is illustrated and described as being mounted in a wirebond configuration, in other embodiments, electronic component 104 is mounted in a different configuration such as a flip chip configuration. In another embodiment, a plurality of electronic components are mounted, e.g., in a stacked configuration.

Formed on upper surface 102U of substrate 102 are electrically conductive upper, e.g., first, traces 114, e.g., formed of copper. Bond pads 110 are electrically connected to upper traces 114, e.g., bond fingers thereof, by electrically conductive bond wires 116.

Formed on lower surface 102L of substrate 102 are lower, e.g., second, traces 118. Lower traces 118 are electrically connected to upper traces 114 by electrically conductive vias 120 extending through substrate 102 between upper surface 102U and lower surface 102L. Although not illustrated in FIG. 1, in one embodiment as discussed in greater detail below with reference to FIG. 2, stackable via package 100 further includes solder masks on upper and lower surface 102U, 102L that protect first portions of upper and lower traces 114, 118 while exposing second portions, e.g., terminals and/or bond fingers, of upper and lower traces 114, 118.

Although a particular electrically conductive pathway between bond pads 110 and lower traces 118 is described above, other electrically conductive pathways can be formed. For example, contact metallizations can be formed between the various electrical conductors.

Further, instead of straight though vias 120, in one embodiment, substrate 102 is a multilayer substrate and a plurality of vias and/or internal traces form the electrical interconnection between upper traces 114 and lower traces 118.

In accordance with one embodiment, one or more of upper traces 114 is not electrically connected to lower traces 118, i.e., is electrically isolated from lower traces 118, and electrically connected to bond pads 110. To illustrate, a first upper trace 114A of the plurality of upper traces 114 is electrically isolated from lower traces 118 and electrically connected to a respective bond pad 110. In accordance with this embodiment, the respective bond pad 110 electrically connected to upper trace 114A is also electrically isolated from lower traces 118.

In accordance with one embodiment, one or more of upper traces 114 is electrically connected to both bond pads 110 and to lower traces 118. To illustrate, instead of being electrically isolated from lower traces 118, upper trace 114A is electrically connected to lower traces 118 by a via 120A of the plurality of vias 120. In accordance with this embodiment, the respective bond pad 110 is electrically connected to upper trace 114A and is also electrically connected to lower traces 118.

Via 120A is indicated by dashed lines to signify that formation of via 120A is optional. If via 120A is not formed, upper trace 114A is electrically isolated from lower traces 118. Conversely, if via 120A is formed, upper trace 114 is electrically connected to lower traces 118.

In accordance with one embodiment, one or more of upper traces 114 is not electrically connected to a bond pad 110, i.e., is electrically isolated from bond pads 110, and is electrically connected to lower traces 118. To illustrate, the upper trace 114 to the left of electronic component 104 in the view of FIG. 1 is electrically isolated from bond pads 110 and electrically connected to lower traces 118. In accordance with this embodiment, the respective lower traces 118 electrically connected to the upper trace 114 electrically isolated from bond pads 110 are also electrically isolated from bond pads 110.

Although various examples of connections between bond pads 110, upper traces 114, and lower traces 118 are set forth above, in light of this disclosure, those of skill in the art will understand that any one of a number of electrical configurations are possible depending upon the particular application.

Formed on upper traces 114 are electrically conductive solder balls 122. Illustratively, solder balls 122 are formed of solder. In other embodiments, solder balls 122 are formed of other electrically conductive material such as plated copper or electrically conductive adhesive.

As set forth above, in accordance with various embodiments, upper traces 114 are electrically connected to lower traces 118, to bond pads 110, and/or to lower traces 118 and bond pads 110. Thus, in accordance with various embodiments, solder balls 122 are electrically connected to lower traces 118 only, to bond pads 110 only, and/or to both lower traces 118 and bond pads 110.

Electronic component 104, bond wires 116, solder balls 122 and the exposed portions of upper surface 102U including upper traces 114 are enclosed, sometimes called encased, encapsulated, and/or covered, with a package body 124. Illustratively, package body 124 is a cured liquid encapsulant, molding compound, or other dielectric material. Package body 124 protects electronic component 104, bond wires 116, solder balls 122, and the exposed portions of upper surface 102U including upper traces 114 from the ambient environment, e.g., from contact, moisture and/or shorting to other structures.

Package body 124 includes a principal surface 124P parallel to upper surface 102U of substrate 102. In accordance with this embodiment, package body 124 includes sides 124S extending perpendicularly between substrate 102 and principal surface 124P. Sides 124S are parallel to and lie in the same plane as sides 102S of substrate 102. Thus, package body 124 entirely covers upper traces 114.

Illustratively, stackable via package 100 is formed simultaneously with a plurality of packages in an array or strip. The array or strip is singulated resulting in sides 124S of package body 124 parallel to and lying in the same plane as sides 102S of substrate 102.

Although the terms parallel, perpendicular, and similar terms are used herein, it is to be understood that the described features may not be exactly parallel and perpendicular, but only substantially parallel and perpendicular to within excepted manufacturing tolerances.

To form stackable via package 100 as illustrated in FIG. 1, inactive surface 108 of electronic component 104 is mounted to upper surface 102U of substrate 102 by adhesive 112. Bond pads 110 are electrically connected to upper traces 114 by bond wires 116. Solder balls 122 are formed on upper traces 114. Electronic component 104, bond wires 116, solder balls 122 and the exposed portions of upper surface 102U including upper traces 114 are enclosed within package body 124. Via apertures are formed in package body 124 to expose solder balls 122 as discussed further below.

FIG. 2 is an enlarged cross-sectional view of the region II of stackable via package 100 of FIG. 1 after formation of a via aperture solder ball structure 200 in accordance with one embodiment. Referring now to FIG. 2, substrate 102 includes a solder mask 226, i.e., a dielectric material, on upper surface 102U. A terminal 228 of upper traces 114 is exposed from solder mask 226. Formation of solder mask 226 is optional, and in one embodiment, solder mask 226 is not formed.

Stackable via package 100 includes a via aperture 230 penetrating into package body 124 from principal surface 124P to expose solder ball 122. Although only a single via aperture 230, a single terminal 228 and a single solder ball 122 are illustrated in FIG. 2 and discussed herein, in light of this disclosure, those of skill in the art will understand that a plurality of via apertures 230 are formed. Each via aperture 230 exposes a respective solder ball 122 on a respective terminal 228.

In one embodiment, via aperture 230 is formed using a laser-ablation process. More particularly, a laser is repeatedly directed at principal surface 124P perpendicularly to principal surface 124P. This laser ablates, i.e., removes, portions of package body 124 leaving via apertures 230, sometimes called a through hole.

Although a laser-ablation process for formation of via aperture 230 is set forth above, in other embodiments, other via aperture formation techniques are used. For example, via aperture 230 is formed using selective molding, milling, mechanical drilling, chemical etching and/or other via aperture formation techniques.

As illustrated in FIG. 2, via aperture 230 extends between principal surface 124P of package body 124 and solder ball 122. Accordingly, solder ball 122 is exposed through via aperture 230.

Via aperture 230 tapers from principal surface 124P to solder ball 122. More particularly, the diameter of via aperture 230 in a plane parallel to principal surface 124P is greatest at the top of via aperture 230, and smallest at the bottom of via aperture 230 and gradually diminishes between the top and bottom of via aperture 230. The top of via aperture 230 is located at principal surface 124P and the bottom of via aperture 230 is located between principal surface 124P of package body 124 and upper surface 102U of substrate 102 in this embodiment.

In another embodiment, via aperture 230 has a uniform diameter, i.e., has a cylindrical shape. In yet another embodiment, via aperture 230 tapers from the bottom to the top of via aperture 230. More particularly, the diameter of via aperture 230 in a plane parallel to principal surface 124P is smallest at the top of via aperture 230 and greatest at the bottom of via aperture 230 and gradually increases between the top and bottom of via aperture 230.

Via aperture 230 is defined by a via aperture sidewall 232 and a via aperture shelf 234 of package body 124. Via aperture shelf 234 is the via bottom of via aperture 230. Via aperture sidewall 232 extends between principal surface 124P of package body 124 and via aperture shelf 234. In accordance with this embodiment, via aperture sidewall 232 is in the shape of the lateral surface of an inverted truncated cone, sometimes called a frustum. Via aperture sidewall 232 is thus sometimes called a sloped sidewall.

Via aperture shelf 234 is parallel to upper surface 102U of substrate 102. Via aperture shelf 234 extends from via aperture sidewall 232 to solder ball 122.

As illustrated in FIG. 2, package body 124 encloses a lower, e.g., first, portion 236 of solder ball 122 while an upper, e.g., second, portion 238 of solder ball 122 is exposed through via aperture 230.

Solder ball 122 has a solder ball diameter A, which is the diameter of solder ball 122. Via aperture shelf 234 has a via aperture shelf diameter B, which is the diameter of via aperture shelf 234. Via aperture shelf diameter B is also the diameter of the bottom of via apertures 230 as so is sometimes also called the via bottom diameter B. In accordance with this embodiment, via aperture shelf diameter B is greater than solder ball diameter A. More particularly, solder ball diameter A and via aperture shelf diameter B are governed by the following relation (1):

$$A<B.$$

Via aperture shelf 234 has a via aperture shelf height C from upper surface 102U of substrate 102. More particularly, via aperture shelf height C is the distance between upper surface 102U of substrate 102 and via aperture shelf 234. Via aperture shelf height C is also the distance between upper surface 102U of substrate 102 and the bottom of via aperture 230 so is also sometimes called the via bottom height C. Solder ball 122 has a solder ball height D from upper surface 102U of substrate 102. More particularly, solder ball height D is the distance that solder ball 122 extends from upper surface 102U of substrate 102.

Via aperture shelf height C is greater than or equal to zero and less than one-half of solder ball height D (Solder ball height D is the middle of solder ball 122 in one embodiment). More particularly, via aperture shelf height C and solder ball height D are governed by the following relation (2):

$$0 => C > 1/2 \times D.$$

According to relation (2), via aperture shelf 234 is located below the horizontal great circle of solder ball 122, i.e., below the maximum horizontal width of solder ball 122. Solder ball 122 is approximately spherical. The horizontal great circle is an imaginary circle on solder ball 122 that is parallel with upper surface 102U of substrate 102 and has the same center and radius as solder ball 122, and consequently divides solder ball 122 into two approximately equal parts. Accordingly, the cross-sectional area in a plane parallel to upper surface 102U of substrate 102 of lower portion 236 of solder ball 122 increases between terminal 228 and via aperture shelf 234.

Package body 124 includes a solder ball contact surface 240 in direct physical contact with lower portion 236 of solder ball 122. Solder ball contact surface 240 extends between upper surface 102U of substrate 102 and via aperture shelf 234. The circumference in a plane parallel to upper surface 102U of substrate 102 of solder ball contact surface 240 increases between upper surface 102U of substrate 102 and via aperture shelf 234.

Accordingly, the pocket defined by solder ball contact surface 240 which corresponds to lower portion 236 of solder ball 122 has a maximum diameter opening at via aperture shelf 234. In this manner, it has been surprisingly discovered that gases released during reflow of solder ball 122 are readily vented thus avoiding solder deformation of the solder column formed from solder ball 122 as discussed in greater detail below with reference to FIGS. 17 and 18.

As a further surprising result, solder bridging (shorts) between the solder column formed from solder ball 122 and adjacent solder columns is also avoided by via aperture 230. More particularly, by forming via aperture 230 with via aperture shelf 234, in the event that there is excess solder during the solder reflow of solder ball 122, via aperture 230 provides space for capture of the excess solder. This avoids the excess solder from overflowing on top of principal surface 124P of package body 124 and shorting to other electrically conductive structures such as adjacent solder columns. This is also discussed in greater detail below with reference to FIGS. 17 and 18.

FIG. 3 is an enlarged cross-sectional view of a via aperture solder ball structure 300 in accordance with another embodiment. Via aperture solder ball structure 300 of FIG. 3 is similar to via aperture solder ball structure 200 of FIG. 2 and only the significant differences are discussed below. A solder ball 122A of via aperture solder ball structure 300 of FIG. 3 extends to a height from upper surface 102U of substrate 102 which is less than the height that solder ball 122 of via aperture solder ball structure 200 of FIG. 2 extends from surface 102U of substrate 102.

Referring now to FIG. 3, solder ball 122A is hemispherical in shape. More particularly, solder ball 122A approximates the northern hemisphere and is connected to terminal 228 approximate at the equator.

In accordance with this embodiment, via aperture solder ball structure 300 is governed by: relation (1): A<B; and relation (2): 0=<C<1/2×D, where solder ball diameter A is the diameter of solder ball 122A, via aperture shelf diameter B is the diameter of via aperture shelf 234, via aperture shelf height C is the distance between upper surface 102U of substrate 102 and via aperture shelf 234, and solder ball height D is the distance that solder ball 122A extends from upper surface 102U of substrate 102.

FIG. 4 is an enlarged cross-sectional view of a via aperture solder ball structure 400 in accordance with another embodiment. Via aperture solder ball structure 400 of FIG. 4 is similar to via aperture solder ball structure 200 of FIG. 2 and only the significant differences are discussed below.

Referring now to FIG. 4, via aperture solder ball structure 400 is governed by: relation (1): A<B; and relation (2): 0=<C<1/2×D, where C=0, and where solder ball diameter A is the diameter of solder ball 122, via aperture shelf diameter B is the diameter of via aperture 230B at upper surface 102U, and solder ball height D is the distance that solder ball 122 extends from upper surface 102U of substrate 102.

As there is no via aperture shelf in accordance with this embodiment, via aperture shelf diameter B is sometimes called the via bottom diameter B. Further, as there is no via aperture shelf in accordance with this embodiment, a via aperture sidewall 232B of a via aperture 230B extends from principal surface 124P of package body 124 to upper surface 102U of substrate 102. The via bottom of via aperture 230 is at upper surface 102U of substrate 102. Further, an exposed portion 402 of upper surface 102U around terminal 228 and solder ball 122 is exposed through via aperture 230B.

In accordance with via aperture solder ball structure 400, solder ball 122 is mounted to terminal 228 prior to the formation of package body 124. More particularly, package body 124 is formed to enclose solder ball 122 in a manner similar to that discussed above in reference to FIG. 1. After formation of package body 124, via aperture 230B is formed to expose solder ball 122.

In accordance with another embodiment, solder ball 122 is mounted to terminal 228 after formation of package body 124 and via aperture 230B. In accordance with this embodiment, referring to FIGS. 1 and 4 together, electronic component 104, bond wires 116, and the exposed portions of upper surface 102U including upper traces 114 are enclosed within package body 124. Referring now to FIG. 4, via aperture 230B is formed to expose terminal 228. Solder ball 122 is then mounted to terminal 228 resulting in via aperture solder ball structure 400 as illustrated in FIG. 4.

FIG. 5 is enlarged cross-sectional view of a via aperture solder ball structure 500 in accordance with another embodiment. Via aperture solder ball structure 500 of FIG. 5 is similar to via aperture solder ball structure 200 of FIG. 2 and only the significant differences are discussed below.

In accordance with this embodiment, via aperture solder ball structure 500 is governed by: relation (1): A<B; and relation (2): 0=<C<1/2×D, where solder ball diameter A is the diameter of solder ball 122, via aperture shelf diameter B is the diameter of via aperture shelf 234, via aperture shelf height C is the distance between upper surface 102U of substrate 102 and via aperture shelf 234, and solder ball height D is the distance that solder ball 122 extends from upper surface 102U of substrate 102.

As illustrated in FIG. 5, via aperture solder ball structure 500 allows a substantial amount of misalignment between via aperture 230 and solder ball 122. More particularly, solder ball 122 is not required to be centered within via aperture shelf 234. In one embodiment, solder ball 122 is located within the area defined by via aperture shelf 234. In this particular embodiment, solder ball 122 is formed at the outer periphery of via aperture shelf 234 and, more particularly, is formed at the intersection of via aperture sidewall 232 and via aperture shelf 234.

Referring now generally to FIGS. 1-5, principal surface 124P of package body 124 has a package body height H above upper surface 102U of substrate 102. Package body height H is the distance between upper surface 102U of substrate 102 and principal surface 124P. In accordance with the embodiments illustrated in FIGS. 1-5, package body height H is greater than solder ball height D, i.e., H>D. Recall that solder ball height D is the distance that solder ball 122 (solder ball 122A in FIG. 3) extends from upper surface 102U of substrate 102.

In accordance with another embodiment, referring now to FIG. 1, package body 124 has a principal surface 124P-1. Principal surface 124P-1 is located below the tops of solder balls 122 such that solder balls 122 protrude from package body 124 and extend above principal surface 124P-1. In accordance with this embodiment, principal surface 124P-1 is indicated by the dashed line. A package body height H1 is the distance between upper surface 102U of substrate 102 and principal surface 124P-1. Package body height H1 is less than solder ball height D in accordance with this embodiment, i.e., H1<D.

FIGS. 6, 7, 8, 9 are enlarged cross-sectional views of via aperture solder ball structures 600, 700, 800, 900 in accordance with various embodiments. Via aperture solder ball structures 600, 700, 800, 900 of FIGS. 6, 7, 8, 9 are similar to via aperture solder ball structures 200, 300, 400, 500 of FIGS. 2, 3, 4, 5, respectively. One significant difference is that the height H1 of principal surface 124P-1 of package body 124 is less than solder ball height D of solder balls 122 (solder ball 122A in FIG. 7) in accordance with the embodiments of via aperture solder ball structures 600, 700, 800, 900 of FIGS. 6, 7, 8, 9, respectively.

In accordance with yet another embodiment, referring again to FIG. 1, package body 124 has a principal surface 124P-2. Principal surface 124P-2 is parallel to the tops of solder balls 122 such that the tops of solder balls 122 are even with principal surface 124P-2. In accordance with this embodiment, principal surface 124P-2 is indicated by the dashed dot line. A package body height H2 is the distance between upper surface 102U of substrate 102 and principal surface 124P-2. Package body height H2 is equal to solder ball height D in accordance with this embodiment, i.e., H2=D.

FIGS. 10, 11, 12, 13 are enlarged cross-sectional views of via aperture solder ball structures 1000, 1100, 1200, 1300 in accordance with various embodiments. Via aperture solder ball structures 1000, 1100, 1200, 1300 of FIGS. 10, 11, 12, 13 are similar to via aperture solder ball structures 200, 300, 400, 500 of FIGS. 2, 3, 4, 5, respectively. One significant difference is that the height H2 of principal surface 124P-2 of package body 124 is equal to solder ball height D of solder balls 122 (solder ball 122A in FIG. 11) in accordance with the embodiments of via aperture solder ball structures 1000, 1100, 1200, 1300 of FIGS. 10, 11, 12, 13, respectively.

Figure 14:
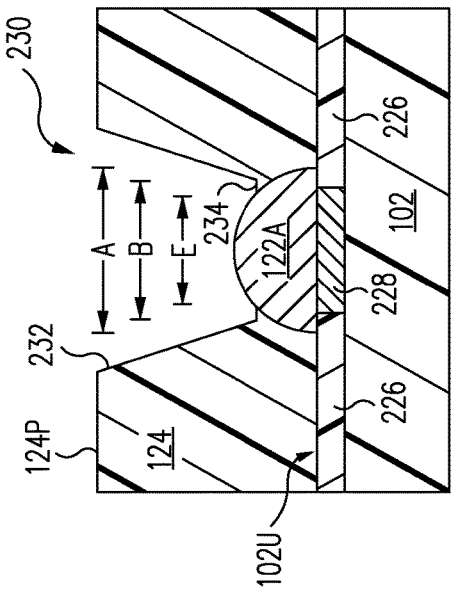
Figure 15:
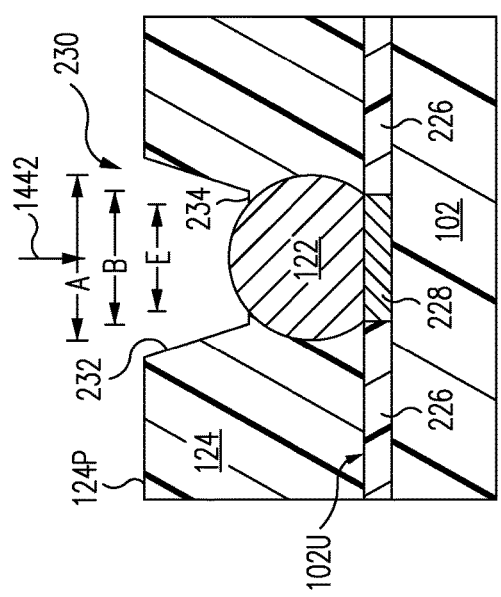
Figure 16:
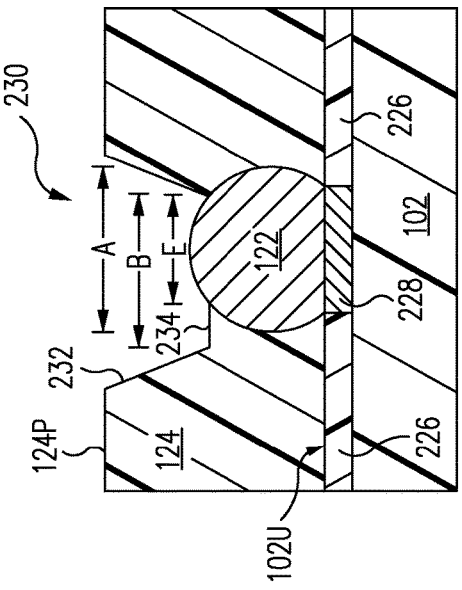

FIGS. 14, 15, 16 are enlarged cross-sectional views of via aperture solder ball structures 1400, 1500, 1600 in accordance with various embodiments. Via aperture solder ball structures 1400, 1500, 1600 of FIGS. 14, 15, 16 are similar to via aperture solder ball structures 200, 300, 500 of FIGS. 2, 3, 5, respectively. Only the significant differences between via aperture solder ball structures 1400, 1500, 1600 of FIGS. 14, 15, 16 and via aperture solder ball structures 200, 300, 500 of FIGS. 2, 3, 5 are discussed below.

Referring now to FIG. 14, solder ball 122 includes an exposed solder ball diameter E. Exposed solder ball diameter E is the diameter of the portion of solder ball 122 exposed from via aperture shelf 234 when viewed perpendicular to principal surface 124P from the topside, i.e., along the line 1442. State another way, exposed solder ball diameter E is the diameter of the circle defined at the intersection of via aperture shelf 234 and solder ball 122, i.e., at the inner periphery of via aperture shelf 234.

Recall that solder ball 122 has solder ball diameter A. Via aperture shelf 234 has via aperture shelf diameter B. In accordance with this embodiment, solder ball diameter A is greater than via aperture shelf diameter B, which is greater than exposed solder ball diameter E. More particularly, solder ball diameter A, via aperture shelf diameter B, and exposed solder ball diameter E are governed by the following relation (3):

$$A>B>E.$$

Referring now to FIG. 15, via aperture solder ball structure 1500 is also governed by relation (3): A>B>E, where solder ball diameter A is the diameter of solder ball 122A, via aperture shelf diameter B is the diameter of via aperture shelf 234, and exposed solder ball diameter E is the diameter of solder ball 122A exposed from via aperture shelf 234.

Referring now to FIG. 16, via aperture solder ball structure 1600 is also governed by relation (3): A>B>E, where solder ball diameter A is the diameter of solder ball 122, via aperture shelf diameter B is the diameter of via aperture shelf 234, and exposed solder ball diameter E is the diameter of solder ball 122 exposed from via aperture shelf 234.

In FIGS. 14, 15, 16, via aperture solder ball structures 1500, 1600, 1700 include principal surface 124P having package body height H greater than solder ball height D of solder balls 122 (solder ball 122A in FIG. 15). Referring now to FIGS. 1, 14, 15, and 16 together, in other embodiments, via aperture solder ball structures 1500, 1600, 1700 are formed to include principal surfaces 124P-1 or 124P-2 having package body height H1 or H2 less than or equal to solder ball height D of solder balls 122 (solder ball 122A in FIG. 15), respectively.

FIG. 17 is a cross-sectional view of an electronic component assembly 1700 including stackable via package 100 of FIGS. 1, 2 during fabrication in accordance with one embodiment. Referring now to FIG. 17, a larger substrate 1750 such as a printed circuit motherboard includes a terminal 1752 formed on a first surface 1750L of larger substrate 1750. An electrically conductive interconnection ball 1754 is formed on terminal 1752. Illustratively, interconnection ball 1754 is formed of solder or solder paste. First surface 1750L further includes a solder mask 1756. Solder mask 1756 is patterned to expose terminal 1752.

FIG. 18 is a cross-sectional view of electronic component assembly 1700 of FIG. 17 at a later stage during fabrication in accordance with one embodiment. Referring now to FIGS. 17 and 18 together, interconnection ball 1754 is placed in contact with solder ball 122 as illustrated in FIG. 17. Assembly 1700 is heated to reflow interconnection ball 1754 and solder ball 122 forming solder column 1858 as illustrated in FIG. 18.

More particularly, interconnection ball 1754 and solder ball 122, e.g., solder, are heated to melt interconnection ball 1754 and solder ball 122. Upon melting, interconnection ball 1754 and solder ball 122 combine into a single molten structure, e.g., molten solder. This molten structure cools and forms solder column 1858. In accordance with this embodiment, solder column 1858 is integral, i.e., is a single unitary structure and not a plurality of different layers connected together.

Gases released during reflow of solder ball 122 are readily vented thus avoiding solder deformation of solder column 1858. Further, solder bridging (shorts) between adjacent solder columns 1858 is also avoided by the structure of via aperture 230. More particularly, by forming via aperture 230 with via aperture shelf 234, in the event that there is excess solder during the solder reflow, via aperture 230 provides space for capture of the excess solder. This avoids the excess solder from overflowing on top of principal surface 124P of package body 124 and shorting to adjacent solder columns 1858.

Solder column 1858 physically and electrically connects terminal 228 of stackable via package 100 with terminal 1752 of larger substrate 1750. Further, package body 124 defines the shape of solder column 1858 at terminal 228. More particularly, solder ball contact surface 240 of package body 124 defines the opening in package body 124 to terminal 228. Solder column 1858 fills this opening, which defines the shape of solder column 1858 at terminal 228.

Further, terminal 1752 and solder mask 1756 of larger substrate 1750 define the shape of solder column 1858 at terminal 1752. More particularly, terminal 1752 is solder wettable, whereas solder mask 1756 is not. Accordingly, solder column 1858 wets (directly contacts and adheres to) terminal 1752 and does not wet (does not contact or adhere to) solder mask 1756. Accordingly, terminal 1752 and solder mask 1756 define the shape of solder column 1858 at terminal 1752.

By defining the shape of solder column 1858 at terminals 228, 1752, reliability in the formation of solder column 1858 is maximized.

FIG. 19 is a cross-sectional view of an electronic component assembly 1900 including a stackable via package having via aperture solder ball structure 400 of FIG. 4 during fabrication in accordance with one embodiment. Referring now to FIG. 19, electronic component assembly 1900 includes larger substrate 1750 having first surface 1750L, terminal 1752, interconnection ball 1754, and solder mask 1756 as discussed above in reference to FIGS. 17, 18, the description of which is not repeated here for purposes of simplicity of discussion.

FIG. 20 is a cross-sectional view of electronic component assembly 1900 of FIG. 19 at a later stage during fabrication in accordance with one embodiment. Referring now to FIGS. 19 and 20 together, interconnection ball 1754 is placed in contact with solder ball 122 as illustrated in FIG. 19. Assembly 1900 is heated to reflow interconnection ball 1754 and solder ball 122 forming solder column 2058.

More particularly, interconnection ball 1754 and solder ball 122, e.g., solder, are heated to melt interconnection ball 1754 and solder ball 122. Upon melting, interconnection ball 1754 and solder ball 122 combine into a single molten structure, e.g., molten solder. This molten structure cools and forms solder column 2058. In accordance with this embodiment, solder column 2058 is integral, i.e., is a single unitary structure and not a plurality of different layers connected together.

Gases released during reflow of solder ball 122 are readily vented through via aperture 2303 thus avoiding solder deformation of solder column 2058. Further, solder bridging (shorts) between solder column 2058 and adjacent solder columns 2058 is also avoided by the structure of via aperture 230B. More particularly, by exposing exposed portion 402 of upper surface 102U around terminal 228 and solder ball 122 through via aperture 230B, in the event that there is excess solder during the solder reflow, via aperture 230B provides space for capture of the excess solder. This avoids the excess solder from overflowing on top of principal surface 124P of package body 124 and shorting to adjacent solder columns 2058.

Solder column 2058 physically and electrically connects terminal 228 with terminal 1752 of larger substrate 1750. Further, terminal 228 and solder mask 226 of substrate 102 define the shape of solder column 2058 at terminal 228. More particularly, terminal 228 is solder wettable, whereas solder mask 226 is not. Accordingly, solder column 2058 wets (adheres to) terminal 228 and does not wet (does not adhere to) solder mask 226. Accordingly, terminal 228 and solder mask 226 define the shape of solder column 2058 at terminal 228.

As discussed above, terminal 1752 and solder mask 1756 of larger substrate 1750 define the shape of solder column 2058 at terminal 1752. By defining the shape of solder column 2058 at terminals 228, 1752, reliability in the formation of solder column 2058 is maximized.

In the embodiments illustrated in FIGS. 17, 18, 19, 20, interconnection ball 1754 is aligned with solder ball 122. More particularly, referring to FIGS. 17, 19, interconnection ball 1754 has a first axis F1 perpendicular to terminal 1752. Solder ball 122 has a second axis F2 perpendicular to terminal 228. First axis F1 is aligned with second axis F2, i.e., axis F1 and axis F2 approximately lie upon a common line. By aligning interconnection ball 1754 with solder ball 122, reliability in the formation of solder columns 1858, 2058 as illustrated in FIGS. 18, 20 is maximized.

However, a via aperture solder ball structure in accordance with one embodiment accommodates a substantial amount of misalignment between interconnection ball 1754 and solder ball 122 as discussed further below in reference to FIGS. 21, 22, 23, 24.

FIG. 21 is a cross-sectional view of electronic component assembly 1700 of FIG. 17 having misalignment between interconnection ball 1754 and solder ball 122 in accordance with one embodiment. Referring to FIG. 21, interconnection ball 1754 is misaligned with solder ball 122. More particularly, first axis F1 of interconnection ball 1754 is offset from second axis F2 of solder ball 122. Interconnection ball 1754 contacts and rests on both solder ball 122 and via aperture sidewall 232.

FIG. 22 is a cross-sectional view of electronic component assembly 1700 of FIG. 21 at a later stage during fabrication in accordance with one embodiment. Referring now to FIGS. 21 and 22 together, assembly 1700 is heated to reflow interconnection ball 1754 and solder ball 122 forming solder column 2258.

Solder column 2258 electrically and physically connects terminal 228 to terminal 1752. Due to the misalignment of interconnection ball 1754 and solder ball 122 and thus the misalignment of terminal 228 and terminal 1752, solder column 2258 is angled, i.e., has an angle of less than 90 degrees, with respect to upper surface 102U of substrate 102. In one embodiment, solder column 2258 rests on and contacts via aperture sidewall 232. In another embodiment, surface tension of solder column 2258 while in the molten state moves larger substrate 1750 with respect to substrate 102 thus aligning terminal 1752 to terminal 228.

FIG. 23 is a cross-sectional view of electronic component assembly 1900 of FIG. 19 having misalignment between interconnection ball 1754 and solder ball 122 in accordance with one embodiment. Referring now to FIG. 23, interconnection ball 1754 is misaligned with solder ball 122. More particularly, first axis F1 of interconnection ball 1754 is offset from second axis F2 of solder ball 122. Interconnection ball 1754 contacts and rests on both solder ball 122 and via aperture sidewall 232B.

FIG. 24 is a cross-sectional view of electronic component assembly 1900 of FIG. 23 at a later stage during fabrication in accordance with one embodiment. Referring now to FIGS. 23 and 24 together, assembly 1900 is heated to reflow interconnection ball 1754 and solder ball 122 forming solder column 2458.

Solder column 2458 electrically and physically connects terminal 228 to terminal 1752. Due to the misalignment of interconnection ball 1754 and solder ball 122 and thus the misalignment of terminal 228 and terminal 1752, solder column 2458 is angled, i.e., has an angle of less than 90 degrees, with respect to upper surface 102U of substrate 102. In one embodiment, solder column 2458 rests on and contacts via aperture sidewall 232B. In another embodiment, surface tension of solder column 2458 while in the molten state moves larger substrate 1750 with respect to substrate 102 thus aligning terminal 1752 to terminal 228.

FIG. 25 is a cross-sectional view of an electronic component assembly 2500 including stackable via package 100 of FIGS. 1, 2 during fabrication in accordance with one embodiment. Referring now to FIG. 25, a larger substrate 2550 such as a printed circuit motherboard includes a terminal 2552 formed on a first surface 2550L of larger substrate 2550. An electrically conductive pin 2554 is formed on terminal 2552. Illustratively, pin 2554 is formed of copper, gold, or other electrically conductive material. In one embodiment, pin 2554 is formed of a material that has a higher melting temperature than solder ball 122 allowing reflow of solder ball 122 without melting of pin 2554. First surface 2550L further includes a solder mask 2556. Solder mask 2556 is patterned to expose terminal 2552 and pin 2554.

FIG. 26 is a cross-sectional view of electronic component assembly 2500 of FIG. 25 at a later stage during fabrication in accordance with one embodiment. Referring now to FIGS. 25 and 26 together, pin 2554 is placed in contact with solder ball 122 as illustrated in FIG. 25. Assembly 2500 is heated to reflow solder ball 122 forming thus encasing pin 2554 in a solder column 2558 as illustrated in FIG. 26. Solder column 2558 extends between terminal 228 and terminal 2552 in this embodiment.

More particularly, solder ball 122 is heated to melt solder ball 122. Upon melting, pin 2554 passes through solder ball 122 to terminal 228. Pin 2554 provides a fixed standoff in accordance with this embodiment, e.g., ensures a fixed space between terminals 228, 2552 equal to the length of pin 2554.

FIG. 27 is a cross-sectional view of an electronic component assembly 2700 including a stackable via package having via aperture solder ball structure 400 of FIG. 4 during fabrication in accordance with one embodiment. Referring now to FIG. 27, electronic component assembly 2700 includes larger substrate 2550 having first surface 2550L, terminal 2552, pin 2554, and solder mask 2556 as discussed above in reference to FIGS. 25-26, the description of which is not repeated here for purposes of simplicity of discussion.

FIG. 28 is a cross-sectional view of electronic component assembly 2700 of FIG. 27 at a later stage during fabrication in accordance with one embodiment. Referring now to FIGS. 27 and 28 together, pin 2554 is placed in contact with solder ball 122 as illustrated in FIG. 27. Assembly 2700 is heated to reflow solder ball 122 thus encasing pin 2554 in solder column 2858 as illustrated in FIG. 28. Solder column 2858 extends between terminal 228 and terminal 2552 in this embodiment.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An electronic package comprising:
a substrate comprising a first substrate side facing a first vertical direction;
a terminal on the first substrate side;
a package interconnect on the terminal; and
a package body on the first substrate side and laterally surrounding the package interconnect, wherein:
the package body comprises a first side on the first substrate, and a second side opposite the first side;
the package body comprises an aperture in which at least a portion of the package interconnect is positioned, the aperture being defined by an interior sidewall of the package body; and
in a vertical cross-section, the interior sidewall comprises:
a first sidewall portion that contacts the package interconnect and comprises a non-zero curvature;
a second sidewall portion that does not contact the package interconnect, wherein a distance between the second sidewall portion and the package interconnect increases in a direction from the first side to the second side; and
the package interconnect extends beyond the second side of the package body.

2. The electronic package of claim 1, wherein the package body comprises a molding material.

3. The electronic package of claim 1, wherein the package interconnect is approximately spherical.

4. The electronic package of claim 1, wherein the package interconnect comprises a solder.

5. The electronic package of claim 1, comprising a dielectric layer on the first substrate side and laterally surrounding the terminal.

6. The electronic package of claim 5, wherein the first sidewall portion meets the dielectric layer at an obtuse angle.

7. The electronic package of claim 1, wherein an empty gap is positioned directly laterally between the second sidewall portion and the package interconnect.

8. An electronic package comprising:
a substrate comprising a first substrate side facing a first vertical direction;
a terminal on the first substrate side;
a package interconnect on the terminal; and
a package body on the first substrate side and laterally surrounding the package interconnect, wherein:
the package body comprises a first side on the first substrate, and a second side opposite the first side,
the package body comprises an aperture in which at least a portion of the package interconnect is positioned, the aperture being defined by an interior sidewall of the package body; and
in a vertical cross-section, the interior sidewall comprises:
a sidewall portion that does not contact the package interconnect, wherein a distance between the second sidewall portion and the package interconnect increases in a direction from the first side to the second side; and the package interconnect extends beyond the second side of the package body.

9. The electronic package of claim 8, wherein the package body comprises a molding material.

10. The electronic package of claim 8, wherein package interconnect is approximately spherical.

11. The electronic package of claim 8, wherein the package interconnect comprises a solder.

12. The electronic package of claim 8, comprising a dielectric layer on the first substrate side and laterally surrounding the terminal.

13. The electronic package of claim 12, wherein the first sidewall portion meets the dielectric layer at an obtuse angle.

14. The electronic package of claim 8, wherein an empty gap is positioned directly laterally between the second sidewall portion and the package interconnect.

15. An electronic package comprising:
a substrate comprising a first substrate side facing a first vertical direction;
a terminal on the first substrate side;
a package interconnect on the terminal; and
a package body on the first substrate side and laterally surrounding the package interconnect, wherein:
the package body comprises a first side on the first substrate, and a second side opposite the first side;
the package body comprises an aperture in which at least a portion of the package interconnect is positioned, the aperture being defined by an interior sidewall of the package body; and
in a vertical cross-section, the interior sidewall comprises a sidewall portion that is entirely separated from the package interconnect, wherein:
an empty gap is positioned directly laterally between the package interconnect and the sidewall portion; and
a width of the empty gap at the first side of the package body is less than a width of the empty gap at the second side of the package body.

16. The electronic package of claim 15, wherein the package body comprises a molding material.

17. The electronic package of claim 15, wherein the package interconnect is approximately spherical.

18. The electronic package of claim 15, wherein the package interconnect comprises a solder.

19. The electronic package of claim 15, comprising a dielectric layer on the first substrate side and laterally surrounding the terminal.

20. The electronic package of claim 19, wherein the first sidewall portion meets the dielectric layer at an obtuse angle.

* * * * *